(12) United States Patent
Iosad et al.

(10) Patent No.: US 8,383,325 B2
(45) Date of Patent: Feb. 26, 2013

(54) LITHOGRAPHIC APPARATUS AND METHOD

(75) Inventors: Nikolay Nikolaevich Iosad, Geldrop (NL); Cheng-Qun Gui, Best (NL)

(73) Assignee: ASML Netherlands B.V., Veldhoven (NL)

( * ) Notice: Subject to any disclaimer, the term of this patent is extended or adjusted under 35 U.S.C. 154(b) by 534 days.

(21) Appl. No.: 12/553,390

(22) Filed: Sep. 3, 2009

(65) Prior Publication Data
US 2010/0068416 A1 Mar. 18, 2010

Related U.S. Application Data

(60) Provisional application No. 61/136,538, filed on Sep. 12, 2008.

(51) Int. Cl.
*G03F 7/20* (2006.01)
*G03F 7/26* (2006.01)

(52) U.S. Cl. .................................. 430/311; 430/396

(58) Field of Classification Search .................. 430/296, 430/311, 396, 942
See application file for complete search history.

(56) References Cited

U.S. PATENT DOCUMENTS 7,846,642 B2 * 12/2010 Ofir et al. ...................... 430/311
2011/0086297 A1 * 4/2011 Yellen et al. ...................... 430/5

OTHER PUBLICATIONS

Kraus, T. et al., "Nanoparticle printing with single-particle resolution", nature nanotechnology, vol. 2, Sep. 2007, pp. 570-576.

* cited by examiner

*Primary Examiner* — Christopher Young
(74) *Attorney, Agent, or Firm* — Pillsbury Winthrop Shaw Pittman LLP

(57) ABSTRACT

A lithographic method includes providing particles in dry form on a substrate, or on material provided on the substrate, irradiating one or more of the particles with a dose of radiation, the dose of radiation being sufficient to ensure that at least one particle of the one or more particles is bonded to the substrate, or to the material provided on the substrate, and removing particles from the substrate, or from material provided on the substrate, that have not been bonded to the substrate, or to the material provided on the substrate.

7 Claims, 4 Drawing Sheets

LITHOGRAPHIC APPARATUS AND METHOD

CROSS-REFERENCE TO RELATED APPLICATIONS

This application claims the benefit of priority from U.S. Provisional Patent Application No. 61/136,538, filed on Sep. 12, 2008, the content of which is incorporated herein by reference in its entirety.

FIELD

The present invention relates to a lithographic apparatus and method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

Many technological processes that are, used in the lithographic processing of rigid substrates are not applicable to flexible substrates. For instance, flexible substrates are formed from materials which may become damaged or destroyed if processed using the high temperatures associated with the processing of rigid substrates.

Photolithographic processes, or more generally photolithography based process blocks for structure fabrication are one of the most expensive processes in electronic IC manufacturing. In general, the high expense originates from the subtractive nature of these photolithographic processes, i.e. the deposition or growth of a layer of material on a substrate followed by a subsequent etching via a photoresist mask of parts of that material. A more cost effective option for structure fabrication (e.g. electronic IC manufacturing) is the use of an additive process such as printing, where material is added to the substrate only in places where that material is needed.

Many different printing processes exist, but each of such printing processes has one or more associated limitations. For instance, offset printing has limited registration capability and also uses materials (i.e. inks) with high viscosity. However, it is difficult to comply with the high viscosity requirement. This is because it is difficult to produce inks which have a high viscosity together with a high charge carrier mobility, which is another requirement that should be met. Inkjet printing, on the other hand, can use inks that have the desired high charge carrier mobility. However, ink materials (e.g. organic materials) with such a high charge carrier mobility generally have low stability. The utilization of inks with nanoparticles enables the production of, for example, stable transistors with high charge carrier mobility. However, by using only a single print step it may be difficult or impossible to print features sizes with micrometer resolution due to the low concentration of nanoparticles in the inks. In order to produce, for example, continuous lines using such inks, it may be necessary to repeat the printing of the same layer several times in order to bring a sufficient amount of nanoparticles onto the substrate. Aerosol nozzle spraying is another additive technique, but this technique also has disadvantages associated with it. Pixel-type printing is not desirable using aerosol nozzle spraying, because the switching on and off of an aerosol nozzle introduces an unacceptably long transient regime. Aerosol nozzle spraying is therefore limited to the field of vector writing.

It is therefore an aspect of the present invention to provide a lithographic method and apparatus that obviates or mitigates one or more of the challenges discussed above.

SUMMARY

According to an aspect of the invention, there is provided a lithographic method comprising: providing particles in dry form on a substrate, or on material provided on the substrate; irradiating one or more of the particles with a dose of radiation, the dose of radiation being sufficient to ensure that at least one particle of the one or more particles is bonded to the substrate, or to the material provided on the substrate; and removing particles from the substrate, or from material provided on the substrate, that have not been bonded to the substrate, or to the material provided on the substrate.

Before being provided on the substrate, or on material provided on the substrate, the particles may be extracted from a particles source using an electric or a magnetic field.

During irradiation, the particles may be held on the substrate, or on material provided on the substrate. During irradiation, the particles may be held on the substrate, or on material provided on the substrate, using an electric field or a magnetic field.

Particles that have not been bonded to the substrate, or to the material provided on the substrate, may be removed using an electric field or a magnetic field.

The particles may have a diameter that is smaller than a desired standard deviation of a critical dimension of a pattern feature to be created on the substrate, or on material provided on the substrate, using the particles.

The particles may be nanoparticles, or particles of a larger size. The particles may be manipulable using, or by, an electric or magnetic field. The particles may be provided on the substrate, or on material provided on the substrate, in the form of a layer.

The dose of radiation may be provided by a radiation beam. The radiation beam may be a patterned radiation beam, such that a pattern of a layer of particles may be irradiated.

Irradiation of the one or more particles may cause the one or more particles to sinter and/or cross-link and/or cross-polymerize and/or alloy, and thereby bond to the substrate or to the material provided on the substrate.

After using a radiation beam to irradiate one or more of the particles with a dose of radiation, the dose of radiation being sufficient to ensure that at least one particle of the one or more particles is bonded to the substrate, or to the material provided on the substrate, annealing of the at least one bonded particle may be undertaken, and/or further irradiation of the at least one bonded particle may be undertaken.

The substrate may be a flexible substrate.

The method may be repeated using: particles comprising the same material; and/or particles comprising different materials.

The material provided on the substrate may be particles that have been previously bonded to the substrate.

According to an aspect of the invention, there is provided a lithographic apparatus comprising: a source of particles in dry form, from which particles in dry form are arranged to be provided on a substrate, or on material provided on the substrate; an exposure arrangement arranged to irradiate one or more of the particles with a dose of radiation, the dose of radiation being sufficient to ensure that at least one particle of the one or more particles is bonded to the substrate, or to the material provided on the substrate; and a particle removal arrangement arranged to remove particles from the substrate, or from material provided on the substrate, that have not been bonded to the substrate, or to the material provided on the substrate.

The lithographic apparatus may further comprise a particle extraction arrangement arranged to extract particles from the source of particles. The particle extraction arrangement may be capable of generating a magnetic field or an electric field in order to extract particles from the source of particles.

The lithographic apparatus may further comprise a particle holding arrangement for holding the particles on the substrate, or on material provided on the substrate, during irradiation of the one or more particles. The particle holding arrangement may be capable of generating a magnetic field or an electric field in order to hold the particles on the substrate, or on material provided on the substrate.

The particle removal arrangement may be capable of generating a magnetic field or an electric field in order to remove the particles from the substrate, or from material provided on the substrate.

The lithographic apparatus may further comprise a particle store for storing particles removed from the substrate.

According to an aspect of the invention, there is provided at least a part of a device made using the method according to embodiments of the invention, or using the apparatus according to embodiments of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
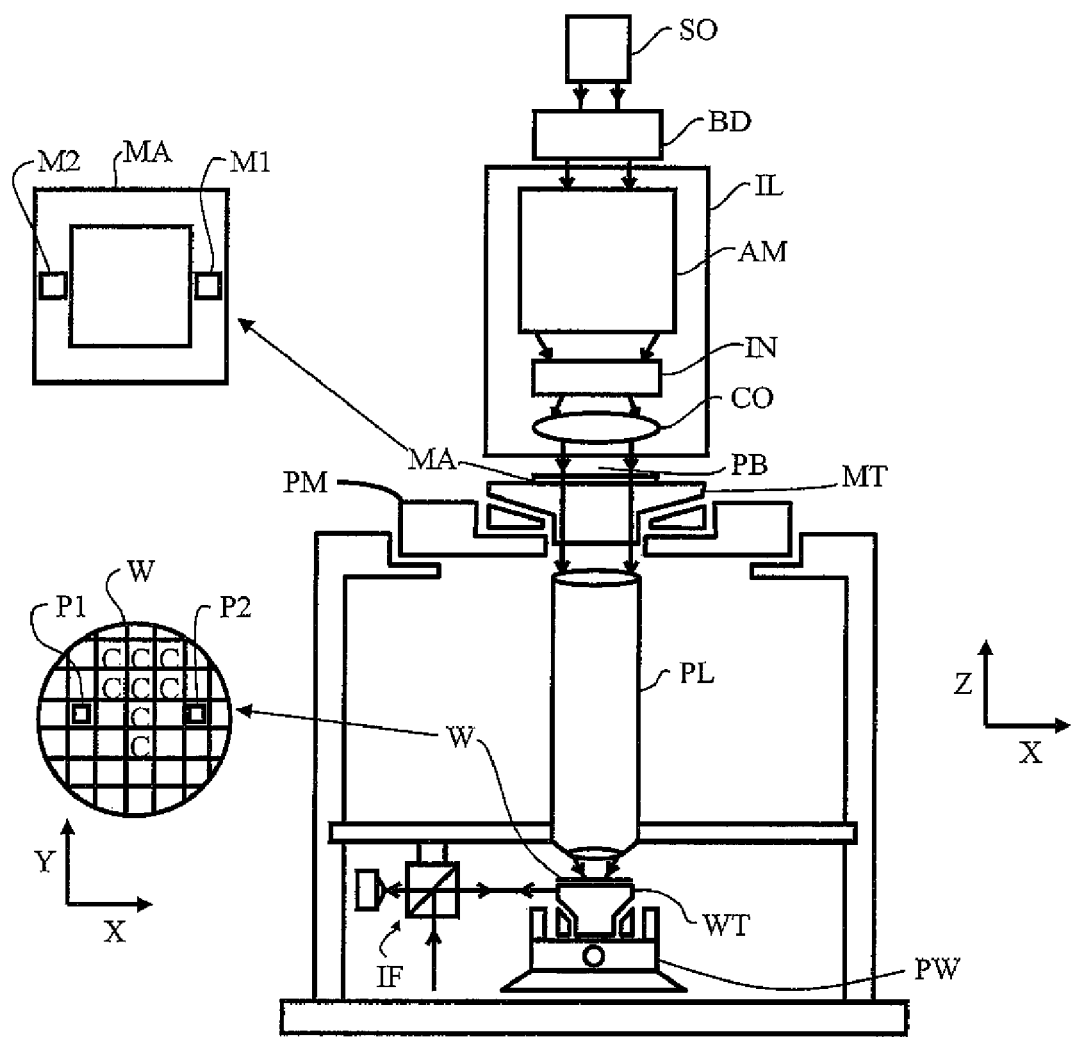
FIG. 1 schematically depicts an embodiment of a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

FIG. 1 schematically depicts an embodiment of a lithographic apparatus. The apparatus comprises: an illumination system (illuminator) IL to condition a beam PB of radiation (e.g. UV radiation or EUV radiation); a support structure (e.g. a support structure) MT to support a patterning device (e.g. a mask) MA and connected to first positioning device PM to accurately position the patterning device with respect to item PL; a substrate table (e.g. a wafer table) WT for holding a substrate W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As discussed above, additive processes like direct printing have been proposed for, for example, the production of flexible electronics. However, existing and proposed additive processes have disadvantages associated with them, for example poor aspect ratios or a lack of an accurate control of material deposition as is used in the additive processes. FIGS. 2a to 2d schematically depict a lithographic method in accordance with an embodiment of the present invention which obviates or mitigates disadvantages associated with prior art additive processes.

Figure 2A:
FIGS. 2a to 2d schematically depict a lithographic method in accordance with an embodiment of the present invention.
Figure 2B:

FIG. 2a depicts a part of a substrate S. FIG. 2b shows that a layer of particles 2 has been provided on the substrate. The layer of particles 2 are in dry form, in so far as that the particles 2 are not in a fluid suspension, or part of an emulsion or colloid, for example. The use of particles in dry form may make it easier to provide the particles on the substrate, in comparison with particles in a fluid suspension or the like. The layer of particles 2 can be kept on the substrate S in any appropriate manner. For example, gravity alone can be sufficient to keep the layer of particles 2 on the substrate S. In other arrangements, electric or magnetic fields may be used to keep appropriately charged, magnetized or magnetisable particles on the substrate S. Uncharged particles may also be kept on the substrate by an electric field, if the electric field can induce an electric dipole moment in the uncharged particles. The use of electric or magnetic fields may be advantageous, since no physical contact with the particles 2 will be required in order to keep the particles 2 on the substrate S.

Figure 2C:
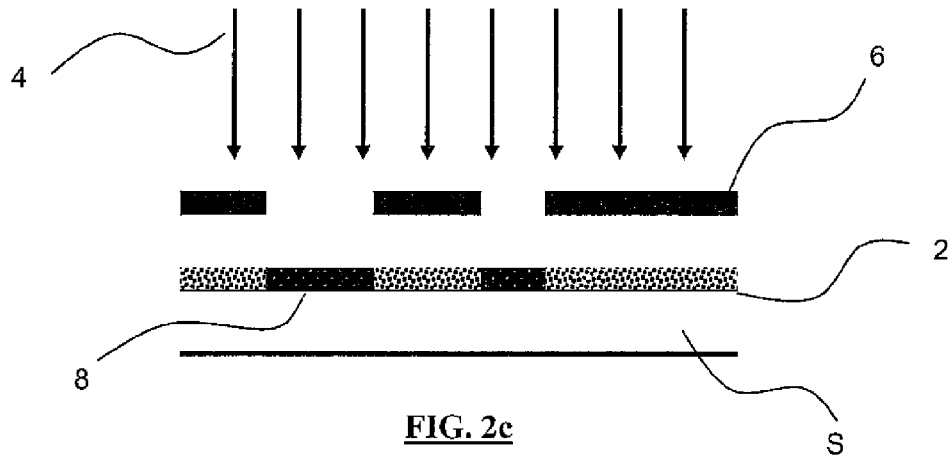

FIG. 2c schematically depicts a beam of radiation 4 (for example, the beam of radiation described above in relation to FIG. 1) being directed towards a patterning device 6 (for example, the mask shown in and described with reference to FIG. 1). The patterning device 6 could be a mask, an array of individually controllable elements (e.g. mirrors), a diffractive optical element, or any other arrangement that is capable of imparting a desired pattern into a radiation beam. The patterning device 6 allows certain parts of the radiation beam 4 to pass through the patterning device 6. Radiation that is able to pass through the patterning device 6 is incident upon specific areas of the layer of particles 2. Particles forming the areas of the layer of particles 2 that are exposed to a sufficient dose of the radiation are sintered by the radiation beam and fix (or in other words bond) to the substrate S. Instead of being sintered, the radiation may cause the particles to cross-link, or undergo any other change which allows the particles to be fixed on the substrate.

Referring to FIG. 2c, sintered and bonded areas 8 of the layer of particles 2 are located in areas of the layer 2 that have been exposed to the radiation beam 4. It will therefore be understood that a desired pattern of sintered and bonded articles 8 may be provided on the substrate S by irradiation of the layer of particles 2 by an appropriately patterned radiation beam. A patterned radiation beam may be formed in any appropriate manner, for example using the lithographic apparatus shown in and described with reference to FIG. 1.

Figure 2D:
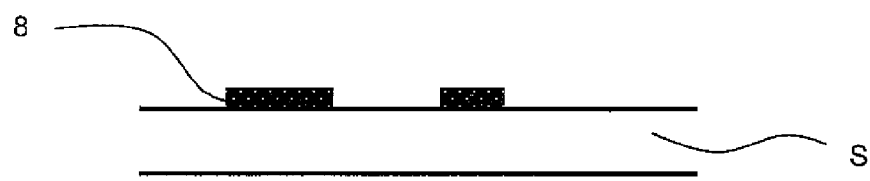

FIG. 2d shows that areas of the layer of particles 2 not exposed to radiation (and therefore not sintered and therefore not bonded to the substrate S) can be removed from the substrate S. The sintered and bonded particles 8 remain on the substrate. Particles 2 not exposed to the radiation beam will still be in dry form, which may make it easier to remove the particles from the substrate, in comparison with particles in a fluid suspension or the like. The particles 2 not exposed to the radiation beam may be removed from the substrate S using electric or magnetic fields, for example.

Further patterns or pattern features may be provided on the substrate by repeating the method shown in and described with reference to FIGS. 2a to 2d with particles comprising the same or different materials. Devices (e.g. electronic devices) may be fabricated by creating one or more patterns or pattern features having certain shapes. One or more of the patterns or pattern features may be formed using particles having, for example, different individual or combined electrical properties (e.g. mobility, conductivity, etc.).

The method shown in and described with reference to FIGS. 2a to 2d can be used to create pattern features with a high aspect ratio. Particles may be sintered and bonded to one another and the substrate to form features which are both narrow (and therefore have a low critical dimension) and which define a thick layer to create a high aspect ratio. Groups or layers of particles may be sintered when they are lactated on top of one another. Alternatively or additionally, particles may be sintered and bonded to particles already sintered and bonded to the substrate, for example in iterations of the method shown in and described with reference to FIGS. 2a to 2d.

The resolution of the pattern features created using the method shown in and described with reference to FIGS. 2a to 2d may be limited by, for example: the resolution of the patterned beam of radiation used to irradiate (or in other words, expose) the layer of particles; the size of the particles; and by any changes in the shape of the particles used to bond the particles to the substrate.

As is known in the art, existing and proposed lithographic apparatus, for example EUV lithographic apparatus, can be used to create pattern features having dimensions of only a few nanometers or tens of nanometers. Therefore, if particles are used which have nanometer diameters, pattern features can be created on the substrate which also have dimensions of the order of nanometers. It will therefore be appreciated that nanoparticles may be suitable particles for providing on a substrate discussed above.

It will be appreciated that the present invention is also applicable to the use of particles in dry form of any size. The particles may have a diameter that is smaller than a desired standard deviation of critical dimension of a pattern feature to be created on the substrate, or on material provided on the substrate, using the particles. Spreading out of the particles on the substrate may be compensated for by correction or alteration of a configuration of a pattern in a patterned radiation beam used to irradiate the particles.

As discussed above, the invention is applicable to particles in dry form of any appropriate diameter. However, nanoparticles in particular may be preferable, since particles having nanometer dimensions will allow features having nanometer dimensions to be created on a substrate. Suitable nanoparticles may be organic, inorganic or hybrid (i.e. organic-inorganic) in nature. Organic nanoparticles may be or comprise dendrimers, phthalocyanine, parylene, poly(methyl methacrylate) beads, polystyrene beads, etc. The organic nanoparticles may be or comprise a mixture of various polymers and/or oligomers. Inorganic nanoparticles may be or comprise Si, $SiO_2$, SiO ZnO, Al, Cu, Ag, Au, ZnS, CdS, CdSe, CdTe, ZnSe, ZnCdSe, CdSeTe, FeS, FeSe, CuS, MnSe, $Fe_2O_3$, ZnO, PbS, PbSe, etc. Hybrid nanoparticles may be or comprise the list of inorganic nanoparticles described previously with some kind of functionalisation, for example being covered or capped, etc. by, for instance, dodecanethiol, octanethiol, 3-aminpropil, carboxylate, trioctylphopshine, hexagecylamine, oleic acid, stearic acid, alkylphosphonic acid, etc. Hybrid nanoparticles may be or comprise inorganic nanoparticles with attached organic radicals that may cover completely or partially the surface of the inorganic nanoparticles. Both organic and hybrid nanoparticles may be provided with or have organic radicals based on acrylates, expoxides, vinyl ethers, etc. which can be cross-polymerized and/or cross-linked and/or molten together by exposure to radiation (i.e. so that they can be fixed to each other and/or the substrate).

Nanoparticles can be manipulated by a magnetic field due to the magnetic properties of inorganic (e.g. diamagnetic, paramagnetic, ferromagnetic) and/or organic (e.g. diamagnetic) components of nanoparticles or due to the interaction of inorganic nanoparticles and attached organic radicals (e.g. ferromagnetic: Au, Cu, Ag, capped with dodecanethiol. Nanoparticles can be manipulated by an electric field if they are electrically charged (e.g. by external corona discharge or due to specific properties of organic shells of inorganic particles like carboxylate) or if an electric dipole is induced in the particle by use of an electric field. Manipulation may include providing the particles on a substrate, holding the particles on a substrate dining exposure to radiation, or removal of particles not exposed to radiation (and therefore not bonded to the substrate) from the substrate.

The utilization of nanoparticles as the particles to be provided on a substrate and bonded to that substrate has additional advantages. Using nanoparticles, it is possible to produce CMOS (n-type and p-type transistors) on flexible (e.g. plastic) and/or rigid substrates at low temperatures. The additive process described herein is at least ten times less expensive than standard Si IC manufacturing. The spectrum of nanoparticles and nanoparticle materials already available is broad. Furthermore, materials which are often considered to be "incompatible" in the processing of rigid substrates may be brought together and used in conjunction with one another when in dry nanoparticle foil.

Figure 3:
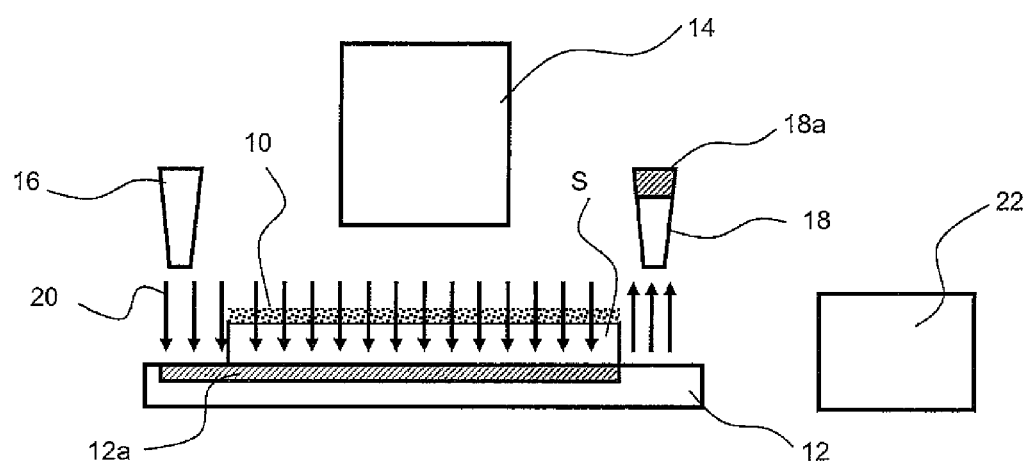
FIG. 3 schematically depicts an apparatus for undertaking the method shown in and described with reference to FIGS. 2a to 2d, in accordance with an embodiment of the present invention.
Figure 4:
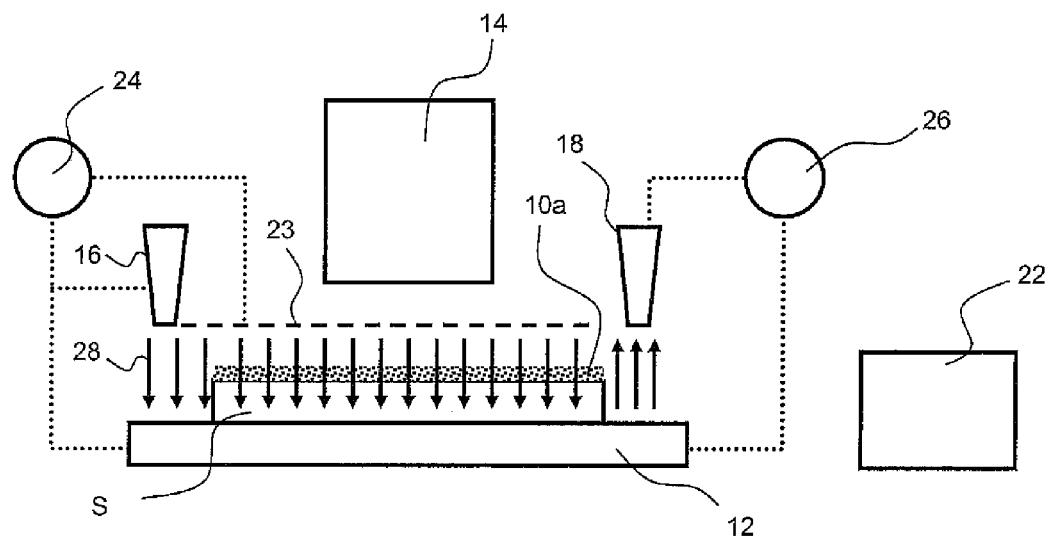
FIG. 4 schematically depicts an apparatus for undertaking the method shown in and described with reference to FIGS. 2a to 2d, in accordance with an embodiment of the present invention.
Figure 5:
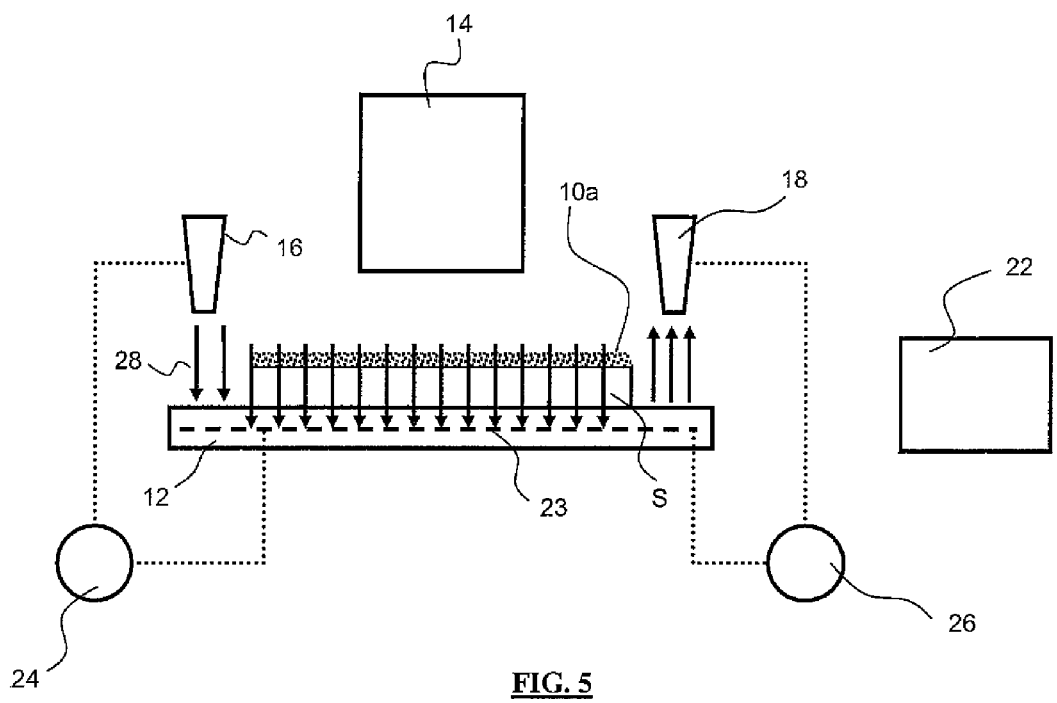
FIG. 5 schematically depicts an apparatus for undertaking the method shown in and described with reference to FIGS. 2a to 2d, in accordance with an embodiment of the present invention.

FIGS. 3 to 5 depict different embodiments of apparatus that may be used to implement the method shown in and described with reference to FIGS. 2a to 2d.

FIG. 3 schematically shows the substrate S shown in and described with reference to FIGS. 2a to 2d. Provided on the substrate S is a layer of nanoparticles 10 in dry form. The substrate S is held in position by a substrate holder 12, for example a substrate table shown in and described with reference to FIG. 1. An exposure arrangement 14 is also provided, and may take the form of all or a part of the lithographic apparatus shown in and described with reference to FIG. 1. The exposure arrangement 14 is able to irradiate the layer of particles 10 with a patterned radiation beam, in order to selectively irradiate and bond (e.g. by sintering) certain particles 10 to the substrate S. FIG. 3 also shows that a source of nanoparticles 16 is provided. The source of nanoparticles 16 provides a source of dry nanoparticles that are able to be manipulated by a magnetic field. A particle store 18 is also provided.

A magnetic field source 12a (e.g. a magnet or the like) is provided in the substrate holder 12. A further magnetic field source 18a is provided adjacent to (or, for example, in) the particle store 18. Magnetic fields 20 generated by the magnetic field source 12a located in the substrate holder 12 and the further magnetic field source 18a located in the particle store 18 are established so that particles 10 located on the substrate S may either experience a force pushing them against the substrate S or pushing them towards the particle store 18, depending on the location of the particles 10 and the substrate S.

In use, the substrate S is moved under the source of nanoparticles 16. Nanoparticles 10 are extracted from the source 16 by the magnetic field 20 generated by the magnetic field source 12a. The nanoparticles 10 are transported towards and onto the substrate S by the magnetic field 20 generated by the magnetic field source 12a. In this manner, the substrate S is covered with a layer of nanoparticles 10. The extraction of the nanoparticles 10, and coating of the substrate S with the nanoparticles 10, is made easier (in comparison with particles in a fluid suspension or the like) because the nanoparticles are in dry form. The nanoparticles 10 are then kept on the surface of the substrate S by the magnetic field 20 generated by the magnetic field source 12a. The vector of the magnetic field 20 in the vicinity of the substrate S does not have to be strictly perpendicular with respect to the substrate's S surface. Instead, the perpendicular component of the force created by the magnetic field 20 has to be sufficient in magnitude to keep the nanoparticles 10 on the surface of the substrate S. Furthermore, a tangential component of the force produced by the magnetic field 20 in the vicinity of the substrate S should be small enough to prevent nanoparticles 10 on the surface of the substrate S being pushed along the surface of the substrate S.

The exposure arrangement 14 is then controlled to expose certain areas of the layer of nanoparticles 10 to a patterned radiation beam. The patterned radiation beam may be provided by, for example, passing a radiation beam through a mask, or by reflecting a radiation beam off an array of individually controllable elements. Radiation that is incident on the layer of nanoparticles is arranged to fix the nanoparticles to the substrate S. This may be achieved in one of a number of ways. For example irradiation by the radiation arrangement 14 may be arranged to: sinter inorganic nanoparticles and bond them to the substrate; remove organic radicals attached to inorganic particles, sintering them and bonding them to the substrate; cause cross-linking (by means of cross-linking agents activated by the radiation); cause cross-polymerization between nanoparticles; cause alloying of organic parts of hybrid nanoparticles and bond the resultant compound to the substrate; or cause cross-linking, and/or cross-polymerization, and/or alloying of organic nanoparticles causing them to bond to the substrate.

It will be understood that particles may need to be irradiated with a certain dose of radiation in order to fix the particles to the substrate. The dose used to fix the particles to the substrate may depend on various properties of the particles, for example the size and material of the particles. The dose used to fix the particles to the substrate may be known from previous experimentation, from modeling, from trial and error, etc.

Particles in the layer of nanoparticles 10 which are not exposed to radiation, and which are therefore not bonded to the substrate may be removed from the substrate S using the further magnetic field source 18a. The magnetic field source 18a ensures that the magnetic field 20 in the vicinity of the particle store 18 is such that particles not bonded to the substrate S are, when passed underneath the particle store 18, drawn into the particle store 18. Recovered nanoparticles in the particle store 18 may be used in future lithographic processing.

An annealing unit 22 may also be provided. An additional and/or optional annealing step (for example involving laser annealing, UV illumination, or oven annealing) may be undertaken to improve properties of the particles bonded to the substrate S (e.g. the strength of the bond to the substrate) and/or remove residual organic material (in the case of hybrid nanoparticles) and/or complete or improve sintering or alloying of the nanoparticles. Additionally or alternatively, further exposure of the particles that are bonded (i.e. fixed) to the substrate may be undertaken in order to, for example, increase the bonding strength of the particles to the substrate. An anneal process, together with a further exposure, may be undertaken in series or simultaneously.

FIG. 3 is applicable for the use of paramagnetic or ferromagnetic particles. For diamagnetic particles the gradients of the magnetic fields need to be oriented in the opposite directions to those shown in FIG. 3. For instance, in order to apply the methods described above using the apparatus of FIG. 3, the apparatus would have to be slightly modified to ensure that the source of a magnetic field 12a is located above the substrate S in order to coat the substrate with a layer of nanoparticles and to hold those nanoparticles on the substrate during the alloying/sintering/bonding process. The further magnetic field source 18a would need to be located below the substrate S in order to cause nanoparticles not exposed to radiation to be directed towards and into the particle store 18.

As discussed above, nanoparticles may also be manipulated using electric fields. Apparatus for implementing the method shown in and described with reference to FIGS. 2a to 2d, and using the manipulation of nanoparticles using electric fields, is shown in and described with reference to FIG. 4.

FIG. 4 schematically depicts the substrate S, the substrate holder 12 the exposure arrangement 14, the particle store 18 and the annealing unit 22 shown in and described with reference to FIG. 3. Further explanation of these features will therefore not be described in more detail here. The source of nanoparticles 16 provides a source of dry nanoparticles that are able to be manipulated by an electric field. A layer of such dry nanoparticles 10a is shown as having been provided on the substrate S.

A transparent electrostatic shield 23 is located between the exposure arrangement 14 and the substrate S. The electrostatic shield is located adjacent to the source of nanoparticles 16. A first voltage source 24 is connected between the transparent electrostatic shield 23 and the substrate holder 12, and also between the source of nanoparticles 16 and the substrate holder 12. A second voltage source 26 is connected between the particle store 18 and the substrate holder 12. Electric fields 28 established by the first voltage source 24 and voltage source 26 are such that the electric field 28 in the vicinity of the substrate S pushes the nanoparticles 10a toward the substrate S, and the electric field 28 in the vicinity of the particle store 18 pushes particles towards and into the particle store 18.

In use, the substrate S is moved under the source of nanoparticles 16. The nanoparticles 10a within the nanoparticle store 16 may be charged by, for example, corona discharge. The nanoparticles 10a are extracted from the source of nanoparticles 16 by the electric field 28 and deposited and kept on the substrate S by the electric field 28. The electric field 28 in the vicinity of the source of nanoparticles 16 is oriented towards the surface of the substrate S if the nanoparticles 10a are charged positively, and away from the substrate if the nanoparticles are charged negatively. If the particles are not charged, they can still be manipulated by electric field if dipole moment is induced by electric field in the particle. The vector of electric field 28 in the vicinity of the substrate S does not have to be strictly perpendicular with respect to the substrate's S surface. Instead, the perpendicular component of the force created by the electric field 28 has to be sufficient in magnitude to keep the nanoparticles 10a on the surface of the substrate S. Furthermore, a tangential component of the force produced by the electric field 28 in the vicinity of the substrate S should be small enough to prevent nanoparticles 10a on the surface of the substrate S being pushed along the surface of the substrate S.

The exposure arrangement 14 is then controlled to expose certain areas of the layer of nanoparticles 10a to a patterned radiation beam. The patterned radiation beam may be provided by, for example, passing a radiation beam through a mask, or by reflecting a radiation beam off an array of individually controllable elements. Radiation that is incident on the layer of nanoparticles 10a is arranged to fix the nanoparticles to the substrate S. This may be achieved in one of a number of ways. For example irradiation by the radiation arrangement 14 may be arranged to: sinter inorganic nanoparticles and bond them to the substrate; remove organic radicals attached to inorganic particles, sintering them and bonding them to the substrate; cause cross-linking (by means of cross-linking agents activated by the radiation); cause cross-polymerization between nanoparticles; cause alloying of organic parts of hybrid nanoparticles and bond the resultant compound to the substrate; or cause cross-linking, and/or cross-polymerization, and/or alloying of organic nanoparticles causing them to bond, to the substrate.

Particles in the layer of nanoparticles 10a which are not exposed to radiation, and which are therefore not bonded to the substrate may be removed from the substrate S using the electric field 28 established by the second voltage source 26. The second voltage source 26 ensures that the electric field 28 in the vicinity of the particle store 18 is such that particles not bonded to the substrate S are, when passed underneath the particle store 18, drawn into the particle store 18. Recovered nanoparticles in the particle store 18 may be used in future lithographic processing.

An annealing unit 22 may also be provided. An additional and/or optional annealing step (for example involving laser annealing, UV illumination, or oven annealing) may be undertaken to improve properties of the particles bonded to the substrate S (e.g. the strength of the bond to the substrate) and/or remove residual organic material (in the case of hybrid nanoparticles) and/or complete or improve sintering or alloying of the nanoparticles. Additionally or alternatively, further exposure of the particles that are bonded (i.e. fixed) to the substrate may be undertaken in order to, for example, increase the bonding strength of the particles to the substrate. An anneal process, together with a further exposure, may be undertaken in series or simultaneously.

In FIG. 4, the electrostatic shield 23 has been described as being transparent. The electrostatic shield 23 is transparent in that it is transparent to radiation generated by the exposure arrangement 14 and which is used to irradiate various areas of the layer of nanoparticles 10a provided on the substrate S. FIG. 5 shows that, in an embodiment, the electrostatic shield 23 can be located beneath the substrate S (for example, in or on the substrate holder 12 as is shown in the Figure). In order to establish electric fields which are oriented to extract nanoparticles 10a from the source of nanoparticles 16, locate and keep those nanoparticles 10a on the substrate S during irradiation, and then move to the particle store 18 nanoparticles 10a not irradiated, the first and second voltage sources 24, 26 need be appropriately controlled. For instance, for negatively charged nanoparticles 10a the electrostatic shield 23 when located beneath the substrate S would need to be positively biased with respect to the source of nanoparticles 16 and negatively biased with respect to the particle store 18. In another example, for positively charged nanoparticles 10a the electrostatic shield 23 when located beneath the substrate S would need to be negatively biased with respect to the source of nanoparticles 16 and positively biased with respect to the particle store 18.

It will be understood that if the electrostatic shield 23 is not located in the path of a radiation beam generated by the exposure arrangement 14, the electrostatic shield 23 does not need to be transparent to that radiation beam.

As described above, nanoparticles may be manipulated using electric or magnetic fields. Embodiments described above have shown the use of electrostatic fields or magnetic fields in an independent manner. However, a hybrid method may be undertaken whereby both electrostatic and magnetic fields are used to manipulate nanoparticles which are susceptible to one or both of electrostatic and magnetic fields. For instance, any electrically insulating nanoparticle can be provided with an electrical charge, and nanoparticles can be coated with an organic layer that has or comprises magnetic radicals. Any conducting nanoparticle can sustain an electrical charge if it is coated by a layer of non-conducting organic material. In another example, the interaction of an insulating organic coating with an inorganic nanoparticle may also result in magnetic properties, or the organic coating itself may have magnetic properties. In summary, it will be appreciated that nanoparticles may either have intrinsic properties which allow them to be manipulated using electrostatic or magnetic fields, or may be functionalized in order to allow the particles to be manipulated using electrostatic or magnetic fields.

In a lithographic process similar to that described in relation to a FIGS. 2a to 2d, the manipulation of nanoparticles using both electrostatic and magnetic fields may be utilized in, for example, two ways. For example, nanoparticles may be brought on to the substrate using a magnetic field, and particles not exposed to radiation (and therefore not bonded to the substrate) may be removed from the substrate using an electrostatic field. In another example, the nanoparticles may be brought on to the substrate using an electrostatic field, and particles not exposed to radiation (and therefore not bonded to the substrate) may be removed from the substrate using a magnetic field.

Figure 6:
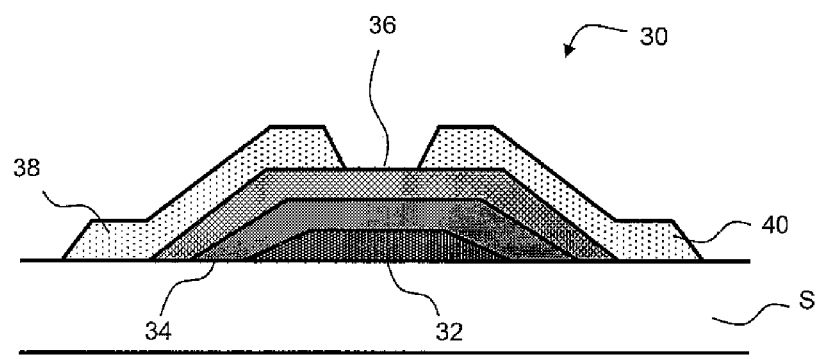
FIG. 6 schematically depicts an electronic device fabricated using a method according to an embodiment of the present invention.

FIG. 6 and the description thereof schematically depicts the construction of an electronic device using the principles discussed in relation to FIGS. 2a to 5. FIG. 6 schematically depicts a bottom gate TFT 30. The bottom gate TFT 30 has been fabricated on a substrate S. The bottom gate TFT comprises a gate 32. Provided on that gate 32 is a gate dielectric 34. Provided on that gate dielectric 34 is a channel 36. Provided on selected portions of the channel 36 is a source 38 and a drain 40. The manner in which the components of the bottom gate TFT 30 are provided on the substrate will now be described.

Magnetic hybrid nanoparticles comprising Cu capped with dodecanethiol are used to provide the gate 32. A magnetic field of approximately 0.1 T extracts nanoparticles from a source of the nanoparticles. An exposure arrangement, powered by a pulsed laser having a wavelength of 355 nm irradiates the particles with a dose 150-300 mJ/cm$^2$. The capping of the nanoparticles is evaporated during the irradiation, and the nanoparticles are sintered and bonded to the substrate.

Nanoparticles of BaTiO$_3$ capped by cyanoethylpullulan are used to provide the gate dielectric 34. An electric field of approximately 1 kV/cm extracts the nanoparticles of BaTiO$_3$ from a source of the nanoparticles. The exposure arrangement irradiates the nanoparticles at a dose of radiation of 150-200 mJ/cm$^2$ in order to alloy organic material in/on the nanoparticles and to form a uniform compound which bonds to the gate 32 and form the gate dielectric 34.

Nanoparticles of indium gallium zinc oxide (IGZO) capped with carboxylate are used to provide the channel 36. The carboxylate make the nanoparticles slightly negatively charged, which reduces or eliminates agglomeration of the nanoparticles. An electric field of approximately 1 kV/cm extracts the charged nanoparticles from the source of nanoparticles. The exposure arrangement exposes the nanoparticles at a reduced dose of 30-50 mJ/cm$^2$ to cause cross-linking (and not sintering) of the nanoparticles. Subsequent annealing in an inert atmosphere causes evaporation of the carboxylate and sintering of the inorganic nanoparticles. The nanoparticles are bonded to the gate dielectric 34, and form the channel 36.

Hybrid nanoparticles of Au capped with dodecanethiol are used to provide the source 38 and drain 40. The capping ensures that the hybrid nanoparticles can be manipulated using a magnetic field. A magnetic field of approximately 0.1 T extracts the nanoparticles from a source of the nanoparticles. The exposure arrangement exposes the nanoparticles to a dose of radiation of 100-150 mJ/cm$^2$. Organic capping of the nanoparticles is evaporated, and the nanoparticles are sintered and bonded to the channel 36 and form the gate 38 and the drain 40.

In the description of FIG. 6, use of an exposure arrangement has been described. In order to create the bottom gate TFT, or any other device or part thereof, the radiation beam used to irradiate (i.e. expose) the respective nanoparticles may be patterned in order to ensure that the one or more pattern features used to form the device have specific shapes and/or sizes.

The above described embodiments are particularly applicable to flexible substrates. This is because the described embodiments can create on a flexible substrate pattern features having a desired critical dimension and aspect ratio, whereas existing processes cannot. It will however be appreciated that the present invention is also applicable to applying patterns and pattern features to rigid substrates.

While specific embodiments of the invention have been described above, it will be appreciated that the invention may be practiced otherwise than as described. The description is not intended to limit the invention.

What is claimed is:

1. A lithographic method comprising:
providing particles in dry form on a substrate;
irradiating one or more of the particles with a dose of radiation, the dose of radiation being sufficient to ensure that at least one particle of the one or more particles is bonded to the substrate;
applying an electric field or a magnetic field during irradiation to hold the one or more particles on the substrate; and
removing particles from the substrate that have not been bonded to the substrate.

2. The method of claim 1, wherein, before being provided on the substrate, or on material provided on the substrate, the particles are extracted from a source of particles using an electric or a magnetic field.

3. The method of claim 1, wherein particles that have not been bonded to the substrate, or to the material provided on the substrate, are removed using an electric field or a magnetic field.

4. The method of claim 1, wherein the particles have a diameter that is smaller than a desired critical dimension of a pattern feature to be created on the substrate, or on material provided on the substrate, using the particles.

5. The method of claim 1, wherein the particles have a diameter that is smaller than a desired standard deviation of a critical dimension of a pattern feature to be created on the substrate, or on material provided on the substrate, using the particles.

6. The method of claim 1, wherein the particles are manipulable by an electric or magnetic field.

7. The method of claim 1, wherein the dose of radiation is provided by a patterned radiation beam.

* * * * *